United States Patent
Sakurai

(10) Patent No.: US 7,903,150 B2
(45) Date of Patent: Mar. 8, 2011

(54) DIFFERENTIAL AMPLIFIER CIRCUIT USED IN SOLID-STATE IMAGE PICKUP APPARATUS, AND ARRANGEMENT THAT AVOIDS INFLUENCE OF VARIATIONS OF INTEGRATED CIRCUITS IN MANUFACTURE AND THE LIKE

(75) Inventor: Katsuhito Sakurai, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 1705 days.

(21) Appl. No.: 11/123,042

(22) Filed: May 6, 2005

(65) Prior Publication Data

US 2005/0195033 A1    Sep. 8, 2005

Related U.S. Application Data

(62) Division of application No. 10/216,740, filed on Aug. 13, 2002, now Pat. No. 6,906,586.

(30) Foreign Application Priority Data

Aug. 27, 2001    (JP) ................ 2001/256520

(51) Int. Cl.
*H04N 5/235* (2006.01)
*H03F 3/45* (2006.01)
*G05F 1/10* (2006.01)
*G05F 3/02* (2006.01)

(52) U.S. Cl. .............. 348/230.1; 330/253; 327/538

(58) Field of Classification Search .......... 348/300, 348/303, 304, 308, 294
See application file for complete search history.

(56) References Cited

U.S. PATENT DOCUMENTS

| | | | |
|---|---|---|---|
| 4,464,588 A | 8/1984 | Wieser | 327/543 |
| 4,779,059 A | 10/1988 | Taki et al. | 330/257 |
| 5,012,140 A | 4/1991 | Bateman | 327/350 |
| 5,157,350 A | 10/1992 | Rubens | 330/254 |
| 5,387,877 A * | 2/1995 | Robinson | 330/254 |
| 5,493,205 A | 2/1996 | Gorecki | 323/315 |
| 5,567,942 A * | 10/1996 | Lee et al. | 250/353 |
| 6,194,696 B1* | 2/2001 | Fossum et al. | 250/208.1 |
| 6,567,571 B1 | 5/2003 | Kochi et al. | 382/312 |
| 6,587,000 B2 | 7/2003 | Oikawa | 330/288 |
| 6,633,334 B1 | 10/2003 | Sakurai et al. | 348/308 |
| 6,734,908 B1* | 5/2004 | Watanabe et al. | 348/308 |
| 6,933,973 B1* | 8/2005 | Sako | 348/308 |
| 7,116,365 B1* | 10/2006 | Ueno et al. | 348/308 |
| 2002/0024001 A1 | 2/2002 | Hiyama et al. | 250/208.1 |

FOREIGN PATENT DOCUMENTS

EP    1054561 A1 *    11/2000

* cited by examiner

*Primary Examiner* — Sinh Tran
*Assistant Examiner* — Albert H Cutler
(74) *Attorney, Agent, or Firm* — Fitzpatrick, Cella, Harper & Scinto

(57) ABSTRACT

The output terminal of a first voltage-current conversion circuit, which includes operational amplifiers and a resistor, is connected to the output terminal of a second voltage-current conversion circuit which includes operational amplifiers and a resistor, and also to the negative input terminal of the second voltage-current conversion circuit via a source follower as an impedance conversion circuit which is formed by an NMOS transistor and constant current source. Furthermore, the output terminal of the first voltage-current conversion circuit serves as the output terminal of a differential amplifier circuit. The positive-phase input terminal of the second voltage-current conversion circuit is connected to a reference voltage. Since the node of the current outputs of the first and second voltage-current conversion circuits has a high impedance, these circuits operate to equalize their output currents.

3 Claims, 11 Drawing Sheets

DIFFERENTIAL AMPLIFIER CIRCUIT USED IN SOLID-STATE IMAGE PICKUP APPARATUS, AND ARRANGEMENT THAT AVOIDS INFLUENCE OF VARIATIONS OF INTEGRATED CIRCUITS IN MANUFACTURE AND THE LIKE

This application is a division of application Ser. No. 10/216,740, filed Aug. 13, 2002.

BACKGROUND OF THE INVENTION

1. Field of the Invention

The present invention relates to a differential amplifier circuit used in an image input apparatus for, e.g., a video camera, digital still camera, and image scanner.

2. Related Background Art

In recent years, a cell size reduction of a photoelectric conversion element is strenuously being made using a micro-patterning process to achieve higher resolution, and a photoelectric conversion signal output is lowering accordingly. Under the circumstance, an amplifier type solid-state image pickup device that can amplify and output a photoelectric conversion signal has received a lot of attention. As such amplifier type photoelectric conversion devices, MOS, AMI, CMD, BASIS devices, and the like are available. Of these devices, a MOS device accumulates photocarriers which is generated by a photodiode, in the gate electrode of a MOS transistor, and charge-amplifies and outputs its change in potential to an output unit in accordance with a drive timing from a scanning circuit. In recent years, of MOS devices, a CMOS solid-state image pickup device as well as its photoelectric conversion unit and peripheral circuit units, all of which are realized by CMOS processes has especially received a lot of attention.

FIG. 11 is a block diagram of a general CMOS solid-state image pickup device. In this example, the anodes of photodiodes D11 to D33 for generating photosignal charges are connected to the ground. The cathodes of the photodiodes D11 to D33 are connected to the gates of amplifier MOS transistors M311 to M333 via transfer MOS transistors M111 to M133. The gates of the amplifier MOS transistors M311 to M333 are connected to the sources of reset MOS transistors M211 to M233 used to reset the transistors M311 to M333. The drains of the reset MOS transistors M211 to M233 are connected to a reset power supply. Furthermore, the drains of the amplifier MOS transistors M311 to M333 are connected to a power supply, and their sources are connected to the drains of select MOS transistors M411 to M433.

The gate of the transfer MOS transistor M111 is connected to a first row select line (vertical scanning line) PTX1 that runs horizontally. The gates of similar transfer MOS transistors M121 and M131 of other pixels connected to the same row are also connected in common to the first row select line PTX1. The gate of the reset MOS transistor M211 is connected to a second row select line (vertical scanning line) PRES1 which runs horizontally. The gates of similar reset MOS transistors M221 and M231 of other pixels connected to the same row are also connected in common to the second row select line PRES1. The gate of the select MOS transistor M411 is connected to a third row select line (vertical scanning line) PSEL1 that runs horizontally. The gates of similar select MOS transistors M421 and M431 of other pixels connected to the same row are also connected in common to the third row select line PSEL1. These first to third row select lines are connected to a vertical scanning circuit 2, and receive signal voltages on the basis of operation timings to be described later. Pixels and row select lines with similar arrangements are connected to the remaining rows shown in FIG. 11. These row select lines receive signals PTX2 and PTX3, PRES2 and PRES3, and PSEL2 and PSEL3 generated by the vertical scanning circuit 2.

The source of the select MOS transistor M411 is connected to a vertical signal line V1 which runs vertically. The sources of similar MOS transistors M412 and M413 of pixels connected to the same column are also connected to the vertical signal line V1. The vertical signal line V1 is connected to a load MOS transistor N82 serving as a load means. The select MOS transistors and load MOS transistors are similarly connected to remaining vertical signal lines V2 and V3 shown in FIG. 11. Furthermore, the sources of the load MOS transistors N82 to N84 are connected to a common GND line 4, and their gates are connected to the gate of an input MOS transistor N81 and in common to a voltage input terminal 5.

Furthermore, the vertical signal line V1 is connected to a capacitor CTN1 used to temporarily hold a noise signal via a noise signal transfer switch N91, and also to a capacitor CTS1 used to temporarily hold a photosignal via a photosignal transfer switch N92. The terminals, opposite to the vertical signal line V1, of the noise signal holding capacitor CTN1 and photosignal holding capacitor CTS1 are connected to the ground. The node between the noise signal transfer switch N91 and noise signal holding capacitor CTN1, and the node between the photosignal transfer switch N92 and photosignal holding capacitor CTS1 are connected to the ground respectively via holding capacitor reset switches N92 and N98, and are connected to a differential amplifier circuit 7 used to calculate the difference between a photosignal and noise signal via horizontal transfer switches N913 and N914. The gates of the horizontal transfer switches N913 and N914 are connected in common to a column select line H1, and to a horizontal scanning circuit 3. Read circuits with similar arrangements are connected to remaining columns V2 and V3 shown in FIG. 11. The gates of the noise signal transfer switches N91, N93, and N95, and photosignal transfer switches N92, N94, and N96 are respectively connected in common to PTN and PTS, and receive signal voltages on the basis of operation timings to be described below.

The operation of the CMOS solid-state image pickup device shown in FIG. 11 will be described below with reference to FIG. 12. Prior to read processes of photosignal charges from the photodiodes D11 to D33, the gates PRES1 of the reset MOS transistors M211 to M231 change to high level. As a result, the gates of the amplifier MOS transistors M311 to M331 are reset to the reset power supply. After the gates PRES1 of the reset MOS transistors M211 to M231 return to low level, the gates PSEL1 of the select MOS transistors M411 to M431 and the gates PTN of the noise signal transfer switches N91, N93, and N95 change to high level. As a result, reset signals (noise signals) superposed with reset noise are read out to the noise signal holding capacitors CTN1 to CTN3.

Then, the gates PTN of the noise signal transfer switches N91, N93, and N95 return to low level. The gates PTX1 of the transfer MOS transistors M111 to M131 change to high level, and photosignal charges in the photodiodes D11 to D31 are transferred to the gates of the amplifier MOS transistors M311 to M331. After the gates PTX1 of the transfer MOS transistors M111 to M131 return to low level, the gates PTS of the photosignal transfer switches N92, N94, and N96 change to high level. As a result, photosignals are read out to the photosignal holding capacitors CTS1 to CTS3. The gates PTS of the photosignal transfer switches N92, N94, and N96 then return to low level. With the operations described so far, noise signals and photosignals of pixels connected to the first row are respectively held in the noise signal holding capacitors CTN1 to CTN3 and photosignal holding capacitors CTS1 to CTS3 connected to the respective columns.

The gates PRES1 of the reset MOS transistors M211 to M231 and the gates PTX1 of the transfer MOS transistors M111 to M131 change to high level to reset photosignal charges in the photodiodes D11 to D31. After that, the gates of the horizontal transfer switches N913 to N918 of respective columns change to high level in turn in response to signals H1 to H3 from the horizontal scanning circuit 3, and voltages held in the noise holding capacitors CTN1 to CTN3 and photosignal holding capacitors CTS1 to CTS3 are sequentially read out to the differential amplifier circuit 7. In between signal read processes of respective columns, the negative (inverting) and positive-phase (non-inverting) input terminals of the differential amplifier circuit 7 are reset to a reset voltage Vres of a horizontal output line by reset switches N919 and N920. The differential amplifier circuit 7 calculates the differences between photosignals and noise signals and sequentially outputs them onto an output terminal OUT. In this manner, the read processes of the pixels connected to the first row are completed.

After that, prior to read processes of the second row, the gates PCTR of reset switches N97 to N912 for the noise signal holding capacitors CTN1 to CTN3 and photosignal holding capacitors CTS1 to CTS3 change to high level to be reset to GND. Likewise, signals of pixels connected to the second and subsequent rows are sequentially read out in response to signals from the vertical scanning circuit 2, thus completing the read processes from all pixels.

In the aforementioned CMOS solid-state image pickup device, it is a common practice to use a differential amplifier circuit using an operational amplifier shown in FIG. 13 as the differential amplifier circuit used to calculate the difference between the photosignal and noise signal. The input/output characteristics in such differential amplifier circuit are determined by:

$$Vout = \frac{Vinp \cdot R94(R91 + R92) - Vinn \cdot (R93 + R94)}{R91 \cdot (R93 + R94)} \quad (1)$$

If R91=R93 and R92=R94, we have:

$$Vout = (Vinp - Vinn) \cdot \frac{R92}{R91}$$

However, when the aforementioned differential amplifier circuit is formed on a single semiconductor substrate such as a monocrystalline silicon substrate by the manufacturing technique of semiconductor integrated circuits, conditions R91=R93 and R92=R94 may deviate due to variations or the like in the manufacture.

For example, if R91=R93 and aR92=R94, equation (1) is rewritten as:

$$Vout = (Vinp - Vinn) \cdot \frac{R92}{R91} + Vinp \cdot \frac{(a-1)R91}{R91 + a \cdot R92}$$

This means that an output appears as Vout even when a signal Vinp=Vinn is input, and the common-mode rejection ratio (to be abbreviated as CMRR hereinafter) impairs. Consequently, the noise rejection ratio of the CMOS solid-state image pickup device impairs.

SUMMARY OF THE INVENTION

It is an object of the present invention to provide a high-performance differential amplifier circuit, and a solid-state image pickup device and image pickup system using the same.

In order to achieve the above object, according to an embodiment of the present invention, there is provided a differential amplifier circuit which comprises positive-phase and negative input terminals and amplifies and outputs a differential voltage between voltages applied to the two terminals, comprising: a first voltage-current conversion circuit, arranged to convert the differential voltage into a current using a first resistor and output the current; and a second voltage-current conversion circuit, arranged to convert a differential voltage between a reference voltage and a voltage obtained by impedance-converting the output from the first voltage-current conversion circuit by an impedance conversion circuit, into a current using a second resistor, wherein the output portions of the first and second voltage-current conversion circuits are connected, and the output portion of the impedance conversion circuit serves as an output terminal of the differential amplifier circuit.

With the above arrangement, even when a differential amplifier circuit is formed on a single semiconductor substrate such as a monocrystalline silicon substrate by the manufacturing technique of semiconductor integrated circuits, a differential amplifier circuit with high CMRR can always be manufactured without being influenced by variations and the like in the manufacture.

Other objects of the present invention will become apparent from the following description of the specification taken in conjunction with the accompanying drawings.

DESCRIPTION OF THE PREFERRED EMBODIMENTS

Preferred embodiments of the present invention will be described hereinafter with reference to the accompanying drawings.

Figure 1:
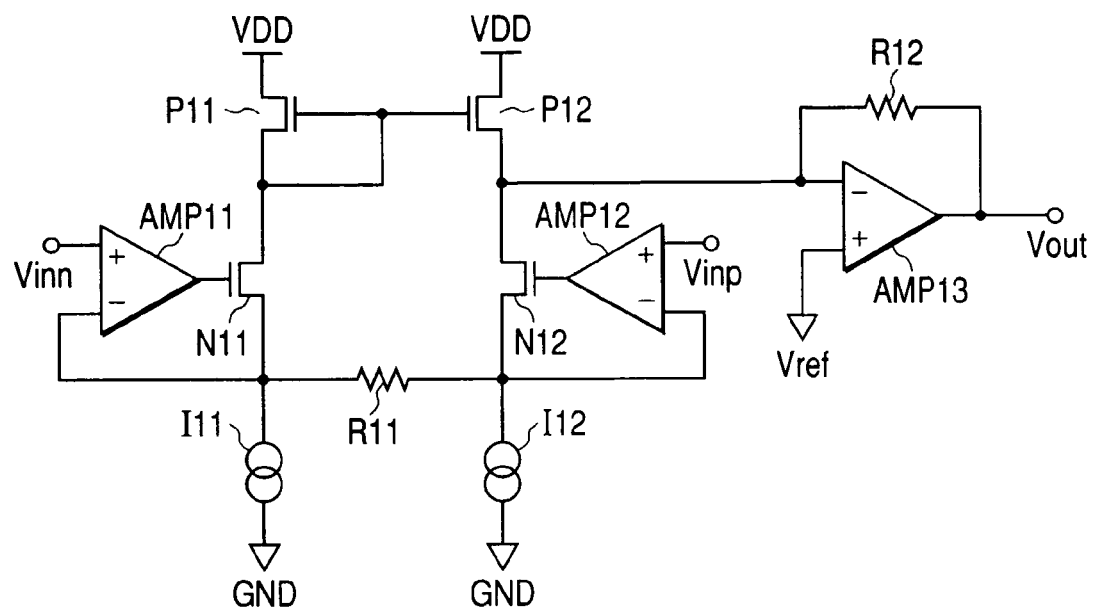
FIG. 1 is a block diagram of a differential amplifier circuit serving as a precondition of the first to fourth embodiments.

FIG. 1 shows the basic arrangement of a differential amplifier circuit serving as a precondition of the first to fourth embodiments. The differential amplifier circuit has a positive-phase input terminal Vinp, negative input terminal Vinn, and output terminal Vout. Also, the circuit has NMOS transistors N11 and N12, PMOS transistors P11 and P12, constant current sources I11 and I12, and resistors R11 and R12. Furthermore, the circuit has operational amplifiers Amp11 to Amp13.

Figure 2:
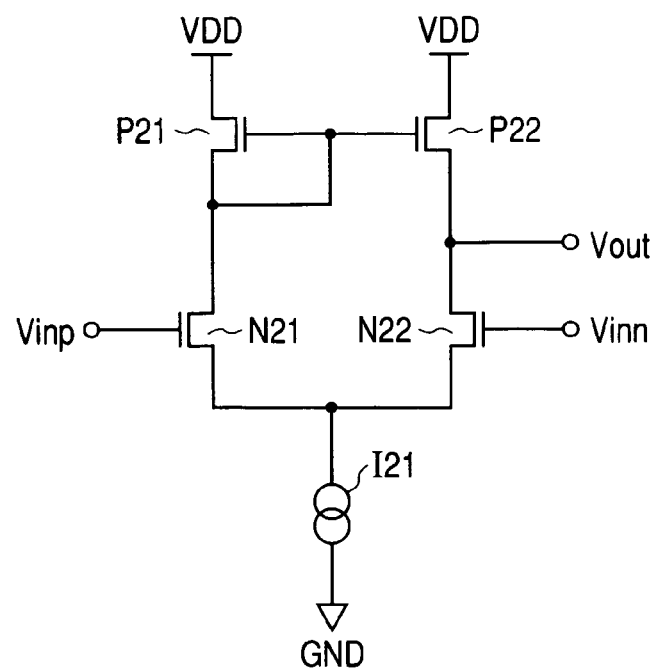
FIG. 2 is a block diagram showing an example of an operational amplifier used in the differential amplifier circuit shown in FIG. 1.

FIG. 2 shows an example of the operational amplifiers Amp11 and Amp12, which include a positive-phase input terminal Vinp, negative input terminal Vinn, output terminal Vout, NMOS transistors N21 and N22, PMOS transistors P21 and P22, and constant current source I21.

Referring to FIG. 1, the NMOS transistors N11 and N12 and the constant current sources I11 and I12 form source followers that serve as the output stages of the operational amplifiers Amp11 and Amp12. The outputs from the source followers are connected to the negative input terminals of the operational amplifiers Amp11 and Amp12, and are connected to each other via the resistor R11. The drain of the NMOS transistor N11 is connected to the input terminal of a current mirror circuit formed by the PMOS transistors P11 and P12. The output terminal of the current mirror circuit is connected to the drain of the NMOS transistor N12, and serves as a current output terminal of a voltage-current conversion circuit.

The operation will be explained below. When differential voltages are input to the positive-phase and negative input terminals Vinp and Vinn, the drain currents of the NMOS transistors N11 and N12 are respectively given by:

$$N11: I = I11 - \frac{Vinp - Vinn}{R11}$$

$$N12: I = I12 + \frac{Vinp - Vinn}{R11}$$

Hence, assuming that I11=I12, as the output of the voltage-current conversion circuit, a differential current:

$$I = 2 \cdot \frac{Vinp - Vinn}{R11}$$

between the drain currents of the NMOS transistors N11 and N12 appears. The output terminal of the voltage-current conversion circuit is connected to the input terminal of a current-voltage conversion circuit formed by the operational amplifier Amp13 having a feedback path which includes the resistor R12. Hence, the output current is converted into a voltage by the resistor R12, thus outputting a voltage:

$$Vout = (Vinp - Vinn) \cdot \frac{2 \cdot R12}{R11} + Vref$$

In the above circuit arrangement, variations of the ratio between the resistors R11 and R12 due to variations of semiconductor integrated circuit in the manufacture never impair CMRR. Hence, a differential amplifier circuit with high CMRR can always be manufactured.

First Embodiment

Figure 3:
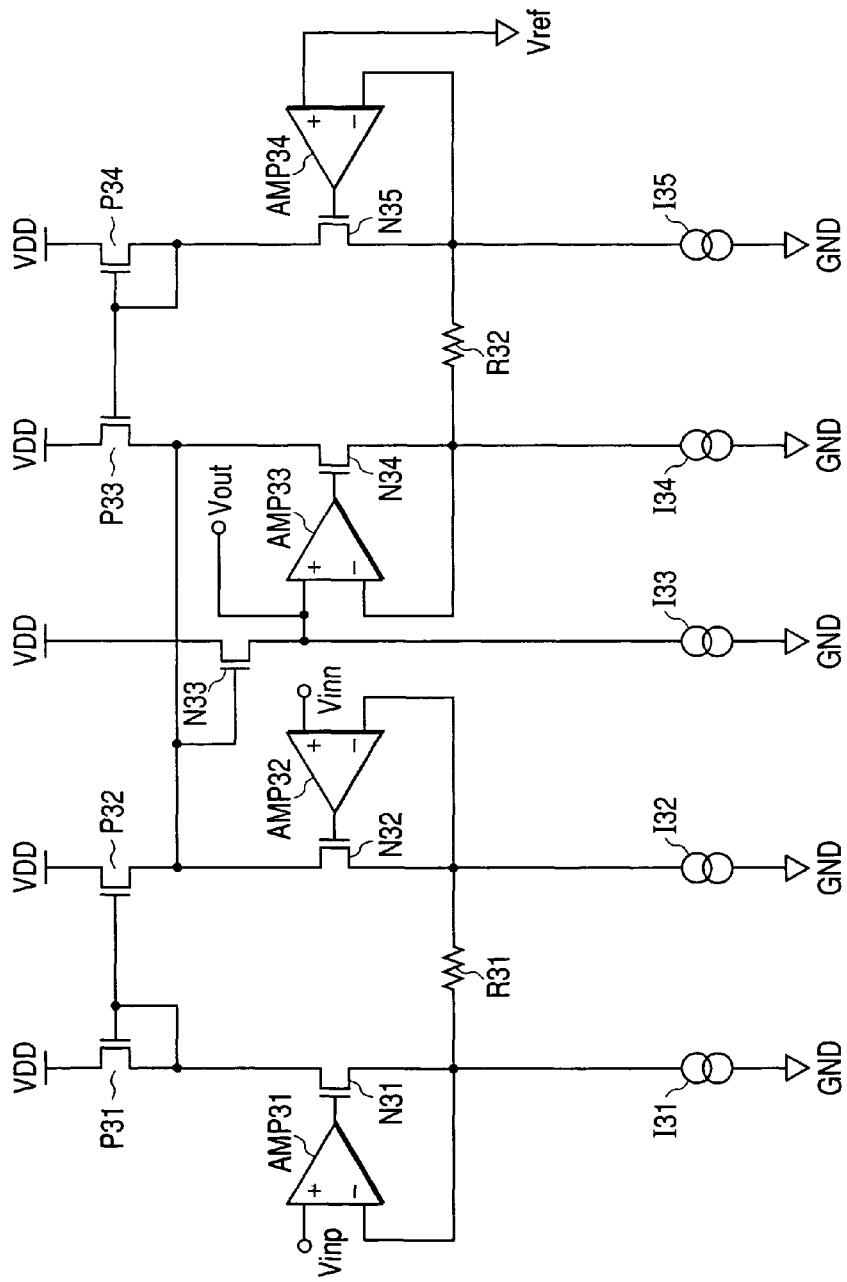
FIG. 3 is a block diagram of a differential amplifier circuit according to the first embodiment of the present invention.

FIG. 3 is a block diagram showing a differential amplifier circuit according to the first embodiment of the present invention. This embodiment adopts a circuit arrangement to which the basic arrangement shown in FIG. 1 is applied. The differential amplifier has a positive-phase input terminal Vinp, negative input terminal Vinn, and output terminal Vout. Also, the circuit has NMOS transistors N31 to N35, PMOS transistors P31 to P34, constant current sources I31 to I35, and resistors R31 and R32. Furthermore, the circuit has operational amplifiers Amp31 to Amp34, each of which is formed by the circuit shown in FIG. 2 as in FIG. 1. The arrangement and operation of a first voltage-current conversion circuit which includes the operational amplifiers Amp31 and Amp32 and the resistor R31 are the same as those in FIG. 1, and this circuit outputs a differential current:

$$I1 = 2 \cdot \frac{Vinp - Vinn}{R31}$$

In this embodiment, the output terminal of the first voltage-current conversion circuit is connected to that of a second voltage-current conversion circuit, which includes the operational amplifiers Amp33 and Amp34 and the resistor R32 as in the first voltage-current conversion circuit, and also to the negative input terminal of the second voltage-current conversion circuit via a source follower as an impedance conversion circuit formed by the NMOS transistor N33 and constant current source I33. Furthermore, the output terminal of the first voltage-current conversion circuit serves as the output terminal Vout of the differential amplifier circuit. The positive-phase input terminal of the second voltage-current conversion circuit is connected to a reference voltage Vref. The operation of the second voltage-current conversion circuit is the same as that of the first voltage-current conversion circuit, and a current:

$$I2 = 2 \cdot \frac{Vref - Vout}{R32}$$

is output to the node, which serves as a current output terminal, between the drains of the NMOS transistor N34 and PMOS transistor P33. Since the node between the current outputs of the two voltage-current conversion circuits has a high input impedance, these circuits operate so as to attain I1=I2. Hence, a voltage:

$$Vout = (Vinp - Vinn) \cdot \frac{R32}{R31} + Vref$$

is output.

In the present invention, even when the ratio between the resistors R31 and R32 varies due to variations of semiconductor integrated circuits in the manufacture, such variations never impair CMRR. Hence, a differential amplifier circuit with high CMRR can always be manufactured. In the differential amplifier circuit of this embodiment, since a feedback signal is a current (feedback is made so as to attain I1=I2), satisfactory frequency characteristics can be obtained even when a high gain is set.

Figure 4:
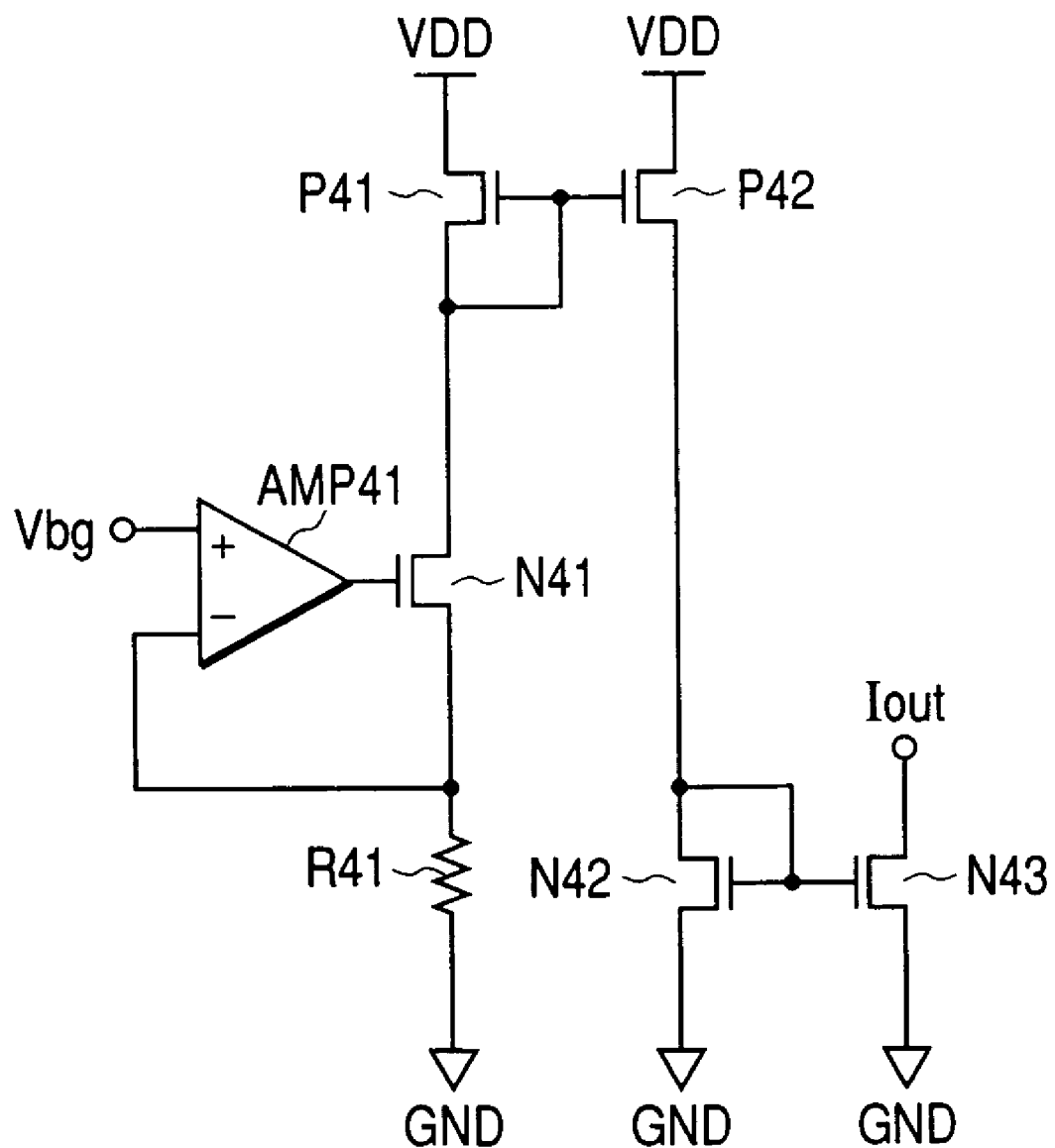
FIG. 4 is a block diagram showing an example of a constant current generation circuit used in the differential amplifier circuit of the present invention.

Furthermore, when each of the constant current sources I31, I32, I34, and I35 uses a constant current generation circuit shown in, e.g., FIG. 4, good temperature characteristics can be obtained in terms of gain and linearity. In FIG. 4, the constant current generation circuit includes an operational amplifier Amp41, NMOS transistors N41 to N43, PMOS transistors P41 and P42, and resistor R41. A constant voltage Vbg has small temperature characteristics like a band gap voltage. The constant current generation circuit has an output terminal Iout. The operational amplifier Amp41 is buffer-connected, and can obtain an output current:

$$Iout = \frac{Vbg}{R41}$$

Using, as the resistor R41, the same type of resistor as the resistors R31 and R32 which form the first and second voltage-current conversion circuits, changes in gain and linearity of the differential amplifier circuit with respect to a change in temperature can be suppressed.

Second Embodiment

Figure 5:
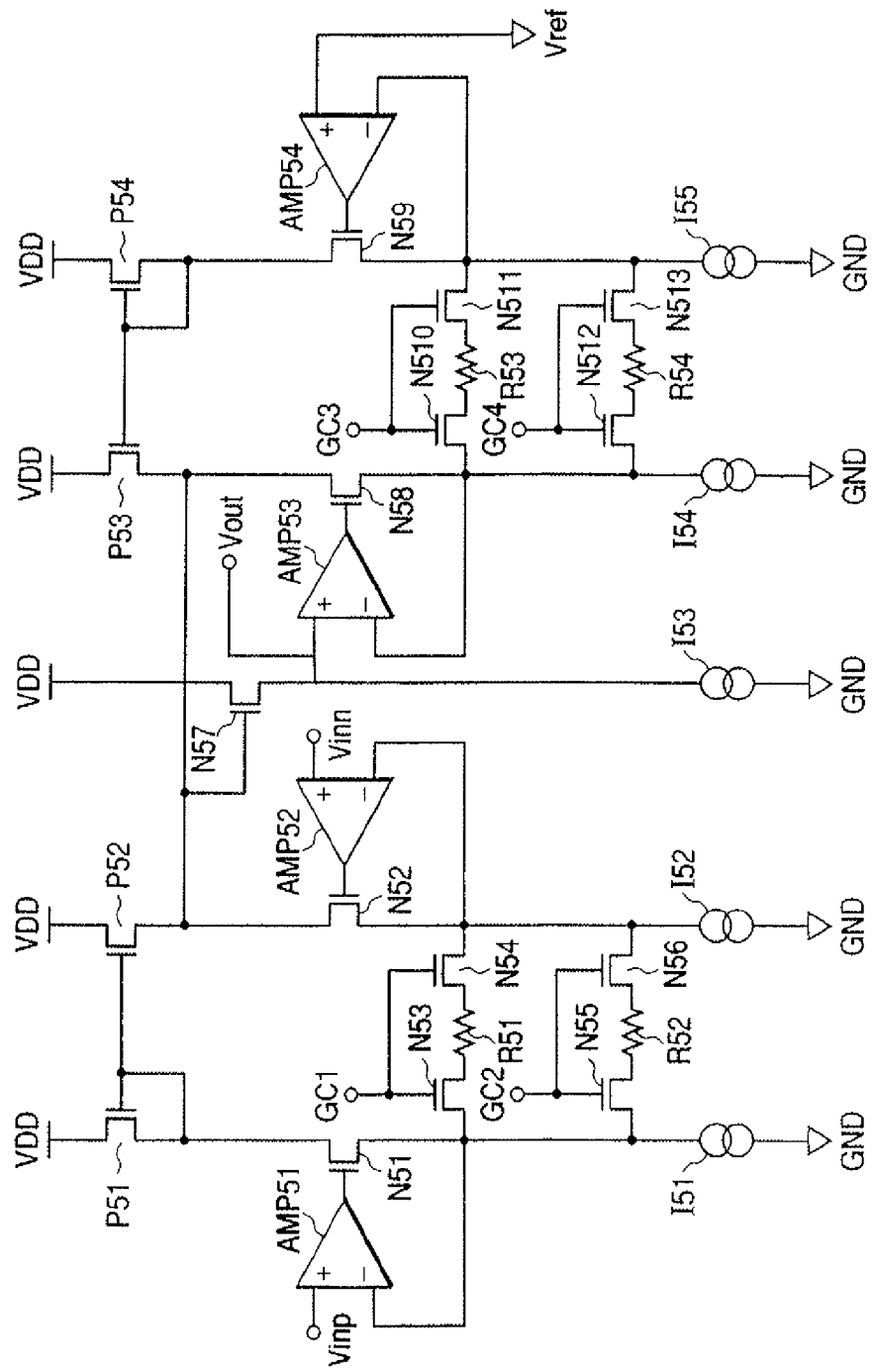
FIG. 5 is a block diagram of a differential amplifier circuit according to the second embodiment of the present invention.

FIG. 5 is a block diagram of a differential amplifier circuit according to the second embodiment of the present invention. The differential amplifier circuit has a positive-phase input terminal Vinp, negative input terminal Vinn, and output terminal Vout. Also, the circuit has NMOS transistors N51 to N513, PMOS transistors P51 to P54, constant current sources I51 to I55, and resistors R51 to R54. In addition, the circuit has operational amplifiers Amp51 to Amp54, each of which is formed by the circuit shown in FIG. 2 as in the first embodiment. The arrangement and operation of the differential amplifier circuit are the same as those in the first embodiment. Furthermore, each of the first and second voltage-current conversion circuits includes a plurality of resistors which are connected via the NMOS transistors N53 to N56 or N510 to N513 as switch elements, and connections of which are controlled by gain control terminals GC1 to GC4. In FIG. 5, each voltage-current conversion circuit includes two resistors for the sake of simplicity, but the present invention is not limited to this. In this embodiment, the same effects as in the first embodiment can be obtained and, also, the gain control of the differential amplifier circuit can be attained by a simple arrangement.

Third Embodiment

Figure 6:
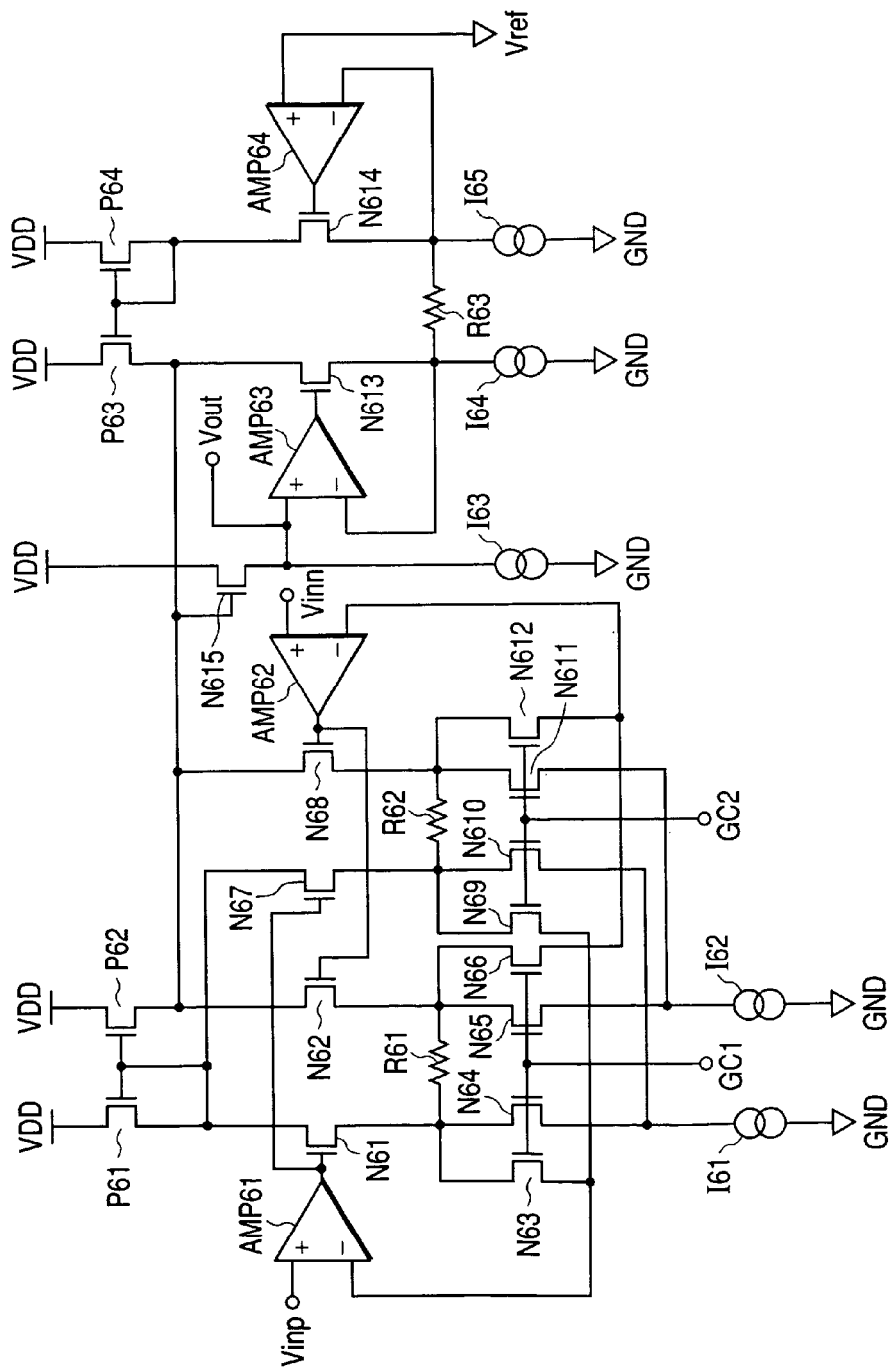
FIG. 6 is a block diagram of a differential amplifier circuit according to the third embodiment of the present invention.

FIG. 6 is a block diagram of a differential amplifier circuit according to the third embodiment of the present invention. The differential amplifier circuit has a positive-phase input terminal Vinp, negative input terminal Vinn, and output terminal Vout. Also, the circuit has NMOS transistors N61 to N615, PMOS transistors P61 to P64, constant current sources I61 to I65, and resistors R61 to R63. In addition, the circuit has operational amplifiers Amp61 to Amp64, each of which is formed by the circuit shown in FIG. 2 as in the first embodiment. This embodiment is substantially the same as the first embodiment, except that means for switching the voltage-current conversion gain is added to the first voltage-current conversion circuit.

The gates and drains of the NMOS transistors N61 and N67, and N62 and N68 are connected in common, and their sources are connected in common to the constant current sources I61 and I62 via the NMOS transistors N64 and N610, and N65 and N611 to form the output stages of the operational amplifiers Amp61 and Amp62 as source followers. The outputs from the source followers are connected in common to the negative input terminals of the operational amplifiers Amp61 and Amp62 via the NMOS transistors N63 and N69, and N66 and N612, and the NMOS transistors N61 and N62, and N67 and N68 are connected to each other via the resistors R61 and R62. The common drain of the NMOS transistors N61 and N67 is connected to the input terminal of a current mirror circuit formed by the PMOS transistors P61 and P62, and the output terminal of the current mirror circuit is connected to the common drain of the NMOS transistors N62 and N68 and also serves as a current output terminal of a voltage-current conversion circuit. The connections of the source followers of the output stages of the operational amplifiers Amp61 and Amp62 are selected by signals input to gain control terminals GC1 and GC2.

The operation of the differential amplifier circuit is the same as that in the first embodiment. When GC1 is at high level and GC2 is at low level, a voltage:

$$Vout = (Vinp - Vinn) \cdot \frac{R63}{R61} + Vref$$

is output. On the other hand, when GC1 is at low level and GC2 is at high level, a voltage:

$$Vout = (Vinp - Vinn) \cdot \frac{R63}{R62} + Vref$$

is output. Since the gain is switched by such arrangement, load capacitances connected to the output stages of the operational amplifiers Amp61 and Amp62 can be reduced, and the number of selectable gain levels can be increased while maintaining good frequency characteristics. In FIG. 6, the first voltage-current conversion circuit has two selectable gain levels for the sake of simplicity. However, by increasing the numbers of source followers of the output stages, resistors, and switch elements, the number of selectable gain levels can be increased.

Fourth Embodiment

Figure 7:
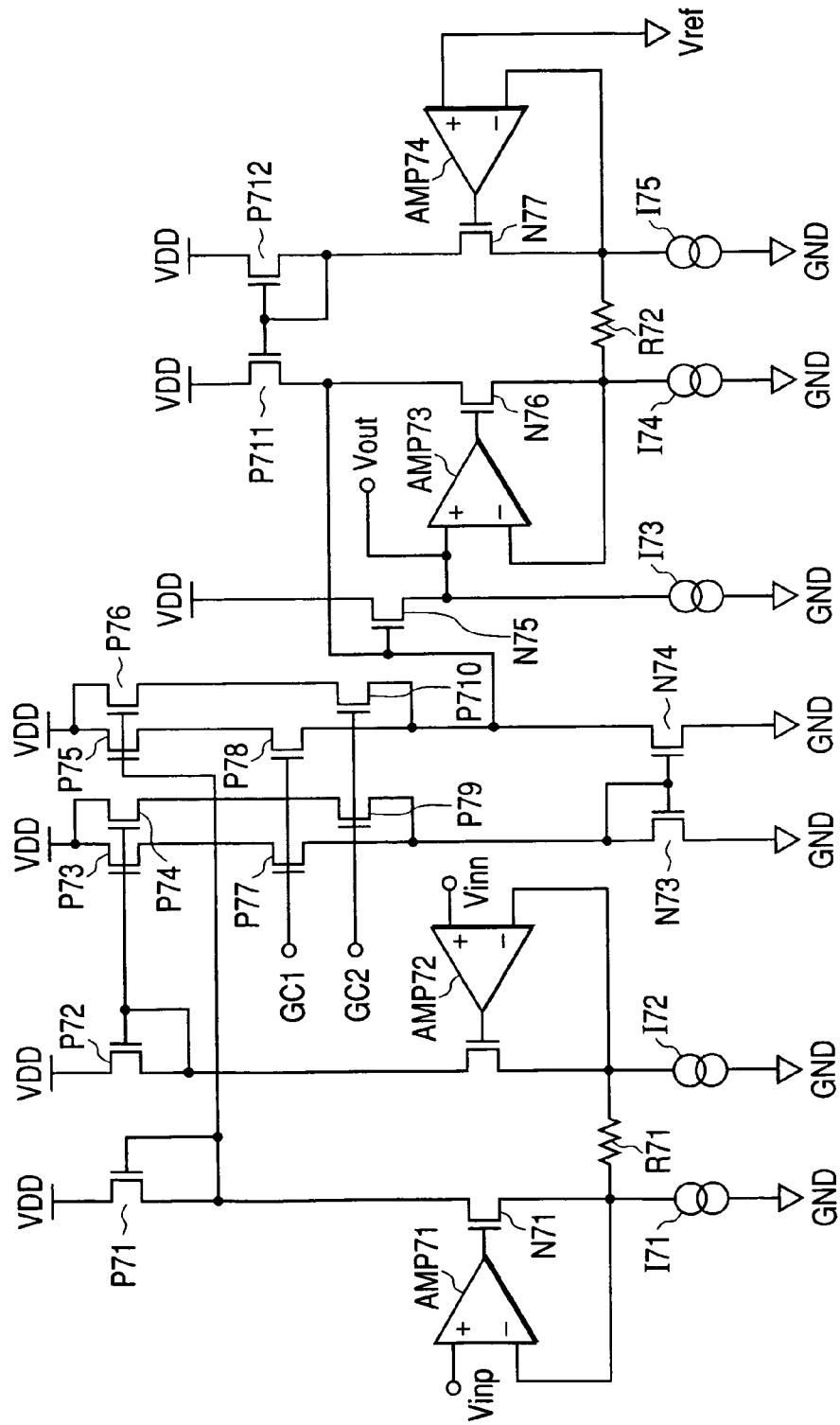
FIG. 7 is a block diagram of a differential amplifier circuit according to the fourth embodiment of the present invention.

FIG. 7 is a block diagram of a differential amplifier circuit according to the fourth embodiment of the present invention. The differential amplifier circuit has a positive-phase input terminal Vinp, negative input terminal Vinn, and output terminal Vout. Also, the circuit has NMOS transistors N71 to N77, PMOS transistors P71 to P712, constant current sources I71 to I75, and resistors R71 and R72. In addition, the circuit has operational amplifiers Amp71 to Amp74, each of which is formed by the circuit shown in FIG. 2 as in the first embodiment. This embodiment implements gain control by an arrangement different from those in the second and third embodiments.

The NMOS transistors N71 and N72 and the constant current sources I71 and I72 form the output stages of the operational amplifiers Amp71 and Amp72 as source followers. The outputs from the source followers are connected to the negative input terminals of the operational amplifiers Amp71 and Amp72, and are connected to each other via the resistor R71. The drain of the NMOS transistor N71 is connected to the input terminal of a first current mirror circuit, which is formed by the PMOS transistors P71, P75, and P76 having the same size in this example, and the drain of the NMOS transistor N72 is connected to the input terminal of a second current mirror circuit, which is formed by the PMOS transistors P72, P73, and P74 having the same size in this example. The drains of the PMOS transistors P73 and P74 are connected in common via the PMOS transistors P77 and P79, so as to switch the mirror ratio by signals input to gain control terminals GC1 and GC2. Also, the drains of the PMOS transistors P75 and P76 are connected in common via the PMOS transistors P78 and P710 to similarly switch the mirror ratio by signals input to the gain control terminals GC1 and GC2. The common drains of the PMOS transistors P77 and P79, and P78 and P710 are respectively connected to the input and output terminals of a third current mirror circuit, which is formed by the NMOS transistors N73 and N74, and the output terminal of the third current mirror circuit serves as a current output terminal of the voltage-current conversion circuit.

The operation of the differential amplifier circuit is the same as that in the second embodiment. When GC1 is at high level and GC2 is at low level, a voltage:

$$Vout = (Vinp - Vinn) \cdot \frac{R72}{R71} + Vref$$

is output. On the other hand, when GC1 is at low level and GC2 is at high level, a voltage:

$$Vout = 2 \cdot (Vinp - Vinn) \cdot \frac{R72}{R71} + Vref$$

is output. Since the gain is switched by such arrangement, the circuit arrangement can be simplified. In FIG. 7, the mirror ratio is switched between 1× and 2×. However; a change in magnification and an increase in the number of levels to be set can be easily implemented by the same arrangement.

Fifth Embodiment

Figure 8:
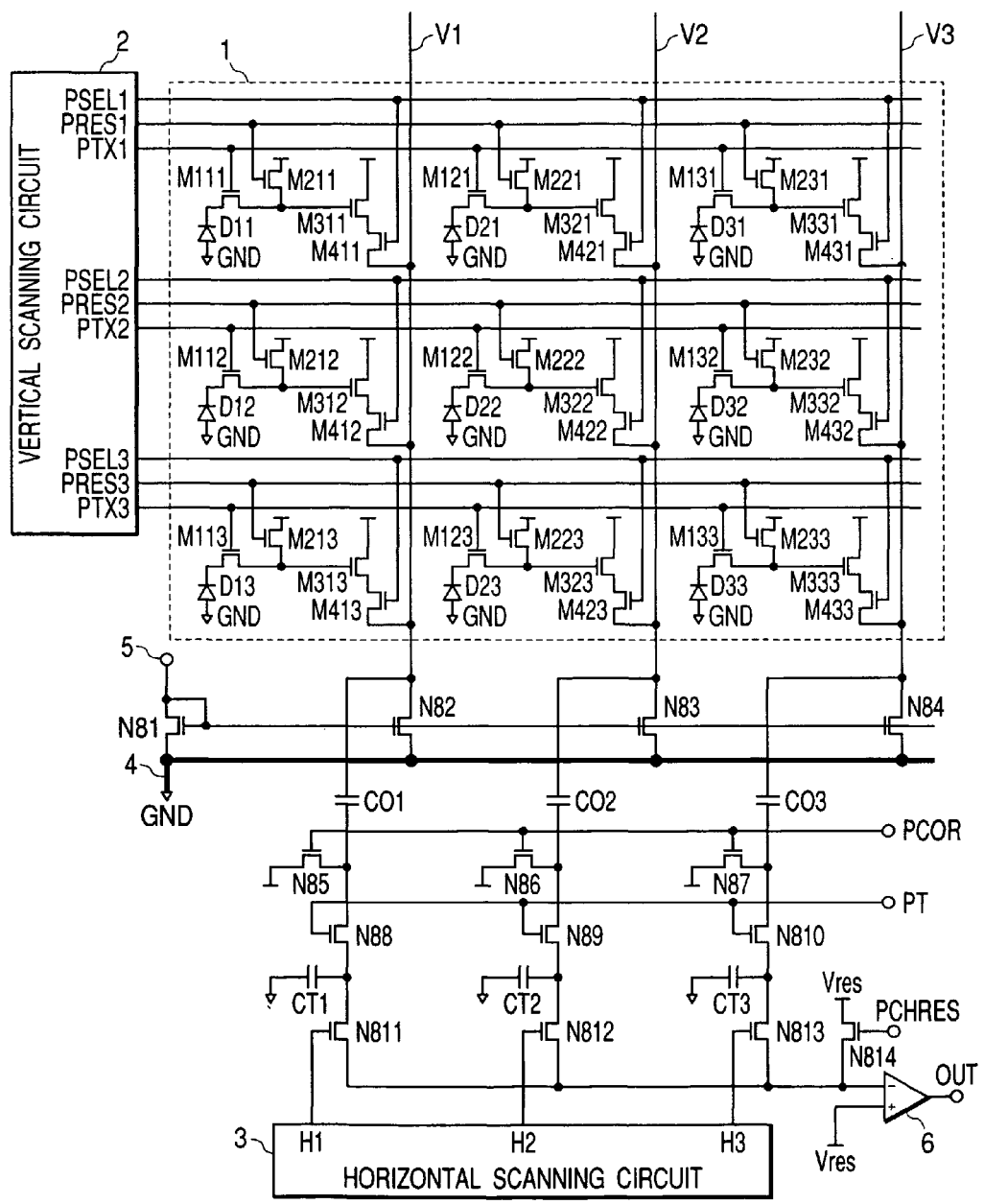
FIG. 8 is a block diagram of a solid-state image pickup device according to the fifth embodiment of the present invention.

FIG. 8 is a block diagram of a solid-state image pickup device according to the fifth embodiment of the present invention, which uses a differential amplifier circuit of one of the first to fourth embodiments. A pixel block 1 of the fifth embodiment has the same arrangement as that in the prior art, and the same reference numerals denote the same parts. A vertical signal line V1 is connected to a capacitor CT1, which temporarily holds a signal, via a clamp capacitor CO1 and transfer switch N88, and also to the negative input terminal of a differential amplifier circuit 6 via a horizontal transfer switch N811. The positive-phase input terminal of the differential amplifier circuit 6 is connected to a reset voltage Vres of a horizontal output line, and its negative input terminal is connected to the reset voltage Vres of the horizontal output line via a reset switch N814. That terminal of the signal holding capacitor CT1, which is opposite to that connected to the vertical signal line V1, is connected to the ground. The node between the clamp capacitor CO1 and transfer switch N88 is connected to a clamp power supply via a clamp switch N85. The gate of the horizontal transfer switch N811 is connected to a column select line H1, and also to a horizontal scanning circuit 3. Read circuits with the same arrangement are connected to remaining columns V2 and V3 shown in FIG. 8. The gates of clamp switches N85 to N87 and those of transfer switches N88 to N810 connected to respective columns are respectively connected in common to a clamp signal input terminal PCOR and transfer signal input terminal PT, and receive signal voltages on the basis of operation timings to be described below.

Figure 9:
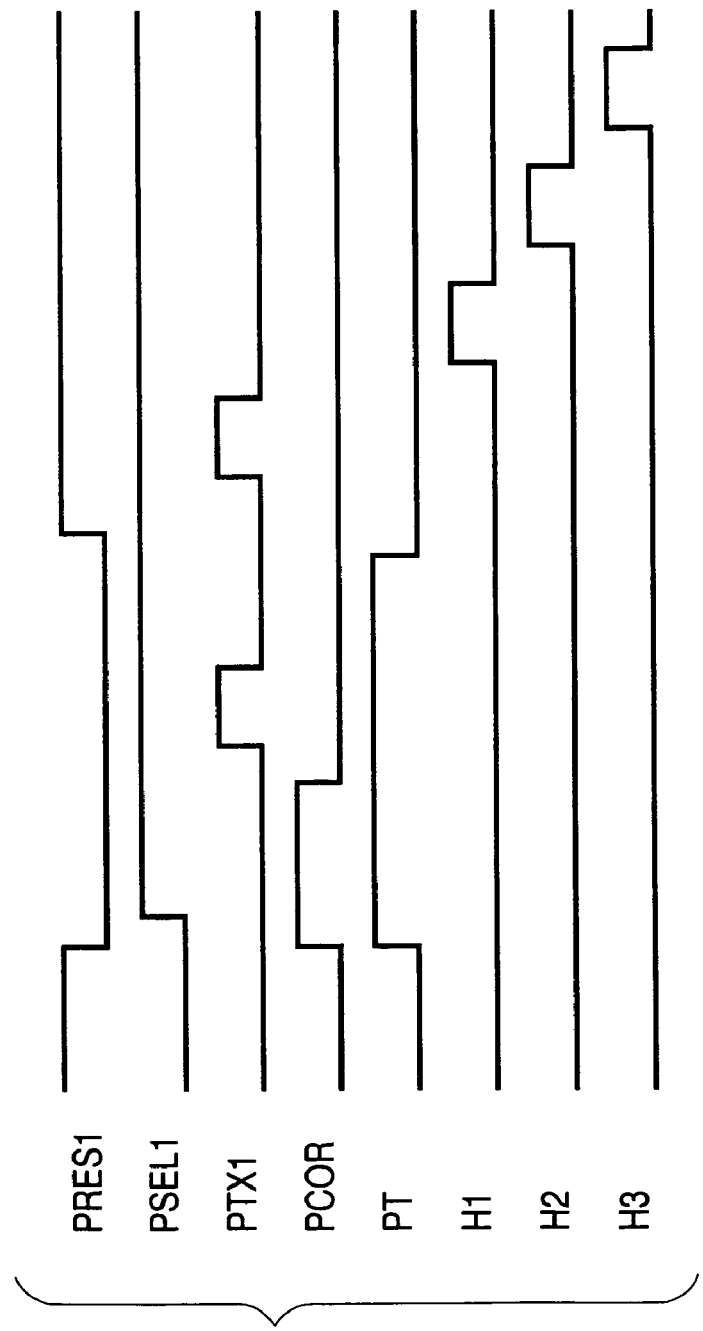
FIG. 9 is a timing chart for explaining the operation of the fifth embodiment.

The operation of this embodiment will be explained below with reference to FIG. 9. Prior to read processes of photosignal charges from photodiodes D11 to D33, the gates PRES1 of reset MOS transistors M211 to M231 change to high level. As a result, the gates of amplifier MOS transistors M311 to M331 are reset to a reset power supply. The gates PRES1 of the reset MOS transistors M211 to M231 return to low level and, at the same time, the gates PCOR of the clamp switches N85 to N87 change to high level. After that, the gates PSELL of select MOS transistors M411 to M432 change to high level. As a result, reset signals (noise signals) superposed with reset noise are read out to the vertical signal lines V1 to V3 and are clamped by the clamp capacitors co1 to CO3. At the same time, the gates PT of the transfer switches N88 to N810 change to high level to reset the signal holding capacitors CT1 to CT8 to a clamp voltage.

The gates PCOR of the clamp switches N85 to N87 then return to low level. The gates PTX1 of transfer MOS transistors M111 to M131 change to high level to transfer photosignal charges of the photodiodes D11 to D31 to the gates of the amplifier MOS transistors M311 to M331. At the same time, photosignals are read out onto the vertical signal lines V1 to V3. After the gates PTX1 of the transfer MOS transistors M111 to M131 return to low level, the gates PT of the transfer switches N88 to N810 change to low level. Hence, change components (photosignals) from the reset signals are read out to the signal holding capacitors CT1 to CT3. With the operations described so far, the photosignals of pixels connected to the first row are respectively held in the signal holding capacitors CT1 to CT3 connected to the respective columns.

The gates PRES1 of the reset MOS transistors M211 to M231 and the gates PTX1 of the transfer MOS transistors M111 to M131 change to high level, thus resetting the photosignal charges in the photodiodes D11 to D31. After that, the gates of horizontal transfer switches N811 to N813 change to high level in turn in response to signals H1 to H3 from the horizontal scanning circuit, and the voltages held in the signal holding capacitors CT1 to CT3 are sequentially read out to the negative input terminal of the differential amplifier circuit, and are sequentially output to an output terminal OUT. In between signal read processes of respective columns, the negative input terminal of the differential amplifier circuit is reset to a reset voltage Vres of the horizontal output line by a reset switches N814. In this manner, the read processes of the pixels connected to the first row are complete. Likewise, signals of pixels connected to the second and subsequent rows are sequentially read out in response to signals from a vertical scanning circuit, thus completing the read processes from all pixels.

Figure 10:
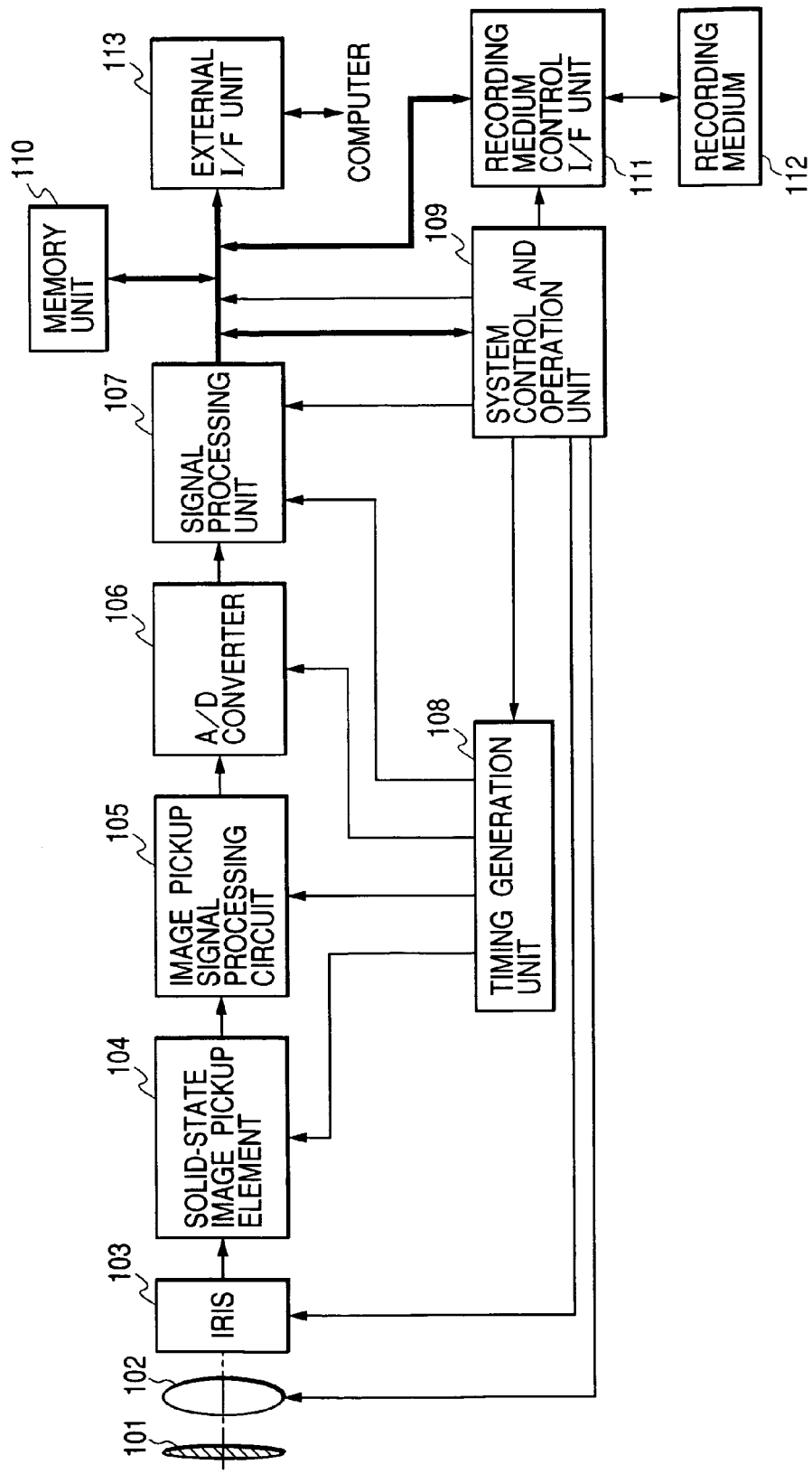
FIG. 10 is a block diagram showing the seventh embodiment of the present invention, in which the solid-state image pickup device according to the fifth embodiment of the present invention is applied to a "still camera"
Figure 11:
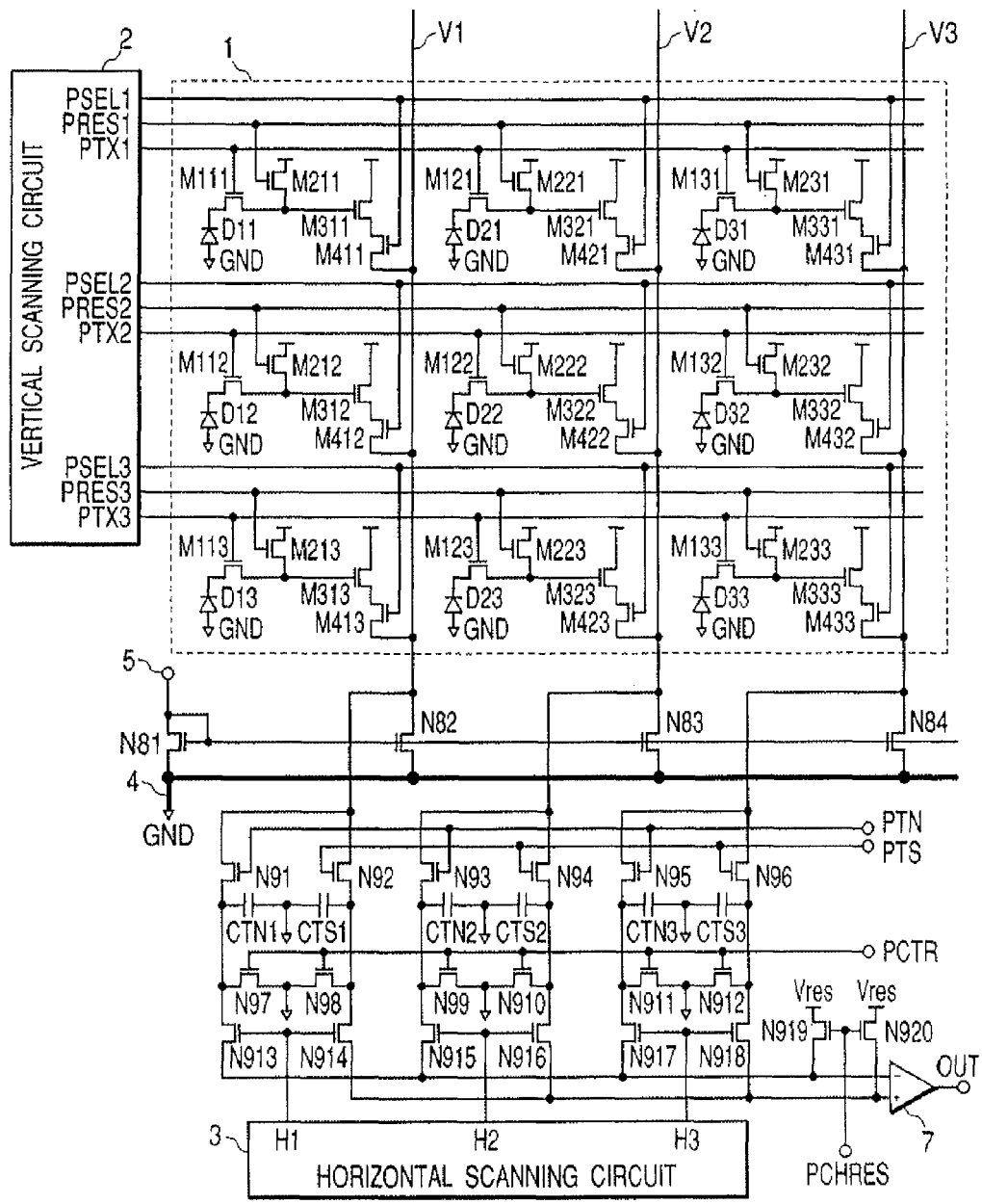
FIG. 11 is a block diagram showing a conventional solid-state image pickup device.
Figure 12:
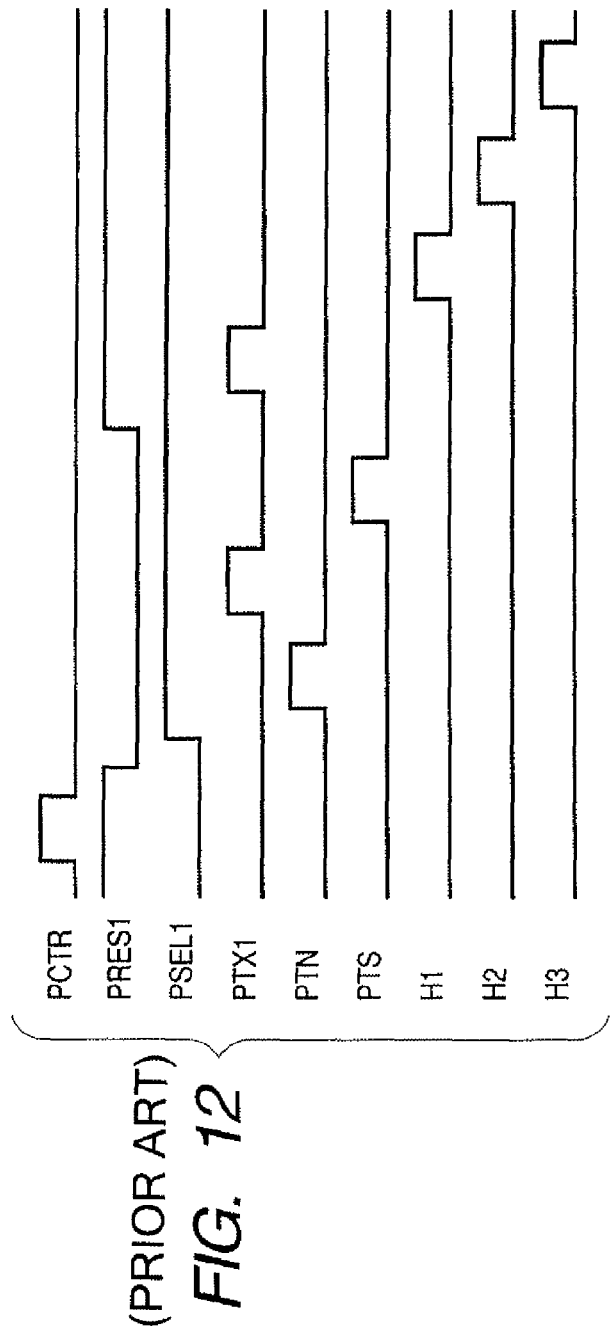
FIG. 12 is a timing chart for explaining the operation of the conventional image pickup device.
Figure 13:
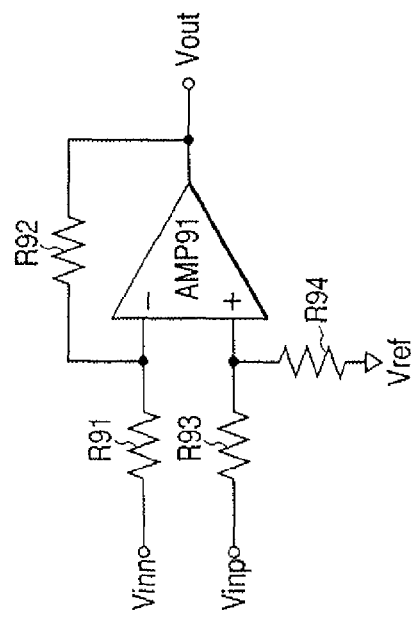
FIG. 13 is a block diagram of a differential amplifier circuit used in the conventional solid-state image pickup device.

FIG. 10 is a block diagram showing a case wherein the solid-state image pickup device of the fifth embodiment is applied to a still camera (image pickup system). The still camera includes a barrier 101 which serves as both a lens protector and main switch, a lens 102 for forming an optical image of an object on a solid-state image pickup element 104, an iris 103 used to vary the amount of light that has passed through the lens 102, the solid-state image pickup element 104 for capturing the object image formed by the lens 102 as an image signal, an A/D converter 106 for analog-to-digital converting the image signal output from the solid-state image pickup element 104 via an image pickup signal processing circuit 105, and a signal processing unit 107 for making various corrections of image data output from the A/D converter 106, and compressing data. The still camera also includes a timing generation unit 108 for outputting various timing signals to the solid-state image pickup element 104, image pickup signal processing circuit 105, A/D converter 106, and signal processing unit 107, a system control and operation unit 109 for making various arithmetic operations and controlling the entire still camera, a memory unit 110 for temporarily storing image data, an interface (I/F) unit 111 for recording or reading out data on or from a recording medium, a detachable recording medium 112 such as a semiconductor memory or the like on or from which image data is recorded or read out, and an interface unit 113 used to communicate with an external computer or the like. Subsequently, a photographing operation of the above-described still camera will be explained.

When the barrier 101 is opened, a main power supply is turned on, a power supply of a control system is then turned on, and a power supply of an image pickup system circuit including the A/D converter 106 and the like is also turned on.

The system control and operation unit 109 fully opens the iris 103 to control an exposure value. A signal output from the solid-state image pickup element 104 is converted into digital data by the A/D converter 106 and the digital data is input to the signal processing unit 107. The system control and operation unit 109 performs an arithmetic operation of an exposure value based on that data.

As a result of this photometry, the brightness is determined, and the system control and operation unit 109 controls the iris in accordance with that determination result.

The system control and operation unit 109 performs an arithmetic operation of the distance to an object on the basis of a high-frequency component extracted from the signal output from the solid-state image pickup element 104. After that, the lens is driven to check if an in-focus state is attained. If it is determined that an in-focus state is not attained, the lens is driven again to perform distance measurement.

After an in-focus state is confirmed, main exposure starts. Upon completion of exposure, an image signal output from the solid-state image pickup element is A/D-converted by the A/D converter 106, and is written in the memory unit by the system control and operation unit 109 via the signal processing unit 107. After that, the data stored in the memory unit 110 is recorded on the detachable recording medium 112 such as a semiconductor memory or the like via the recording medium control I/F unit under the control of the system control and operation unit 109. The stored data may be directly input to a computer via the external I/F unit 113 to process an image.

Many widely different embodiments of the present invention may be constructed without departing from the spirit and scope of the present invention. It should be understood that the present invention is not limited to the specific embodiments described in the specification, except as defined in the appended claims.

What is claimed is:

1. A solid-state image pickup apparatus including a two-dimensional array of pixels each of which includes a photoelectric conversion element which converts an optical signal into signal charges, and an amplification element which amplifies the signal charges, the solid-state image pickup apparatus comprising:

a plurality of vertical signal lines for reading out signals of pixel lines, respectively;

a horizontal output line connected to the plurality of vertical signal lines via a transfer switch; and a differential amplifier circuit connected to the horizontal output line, wherein the differential amplifier circuit comprises:

a first voltage-current conversion circuit for converting a first differential voltage into a first current using a first resistor and for outputting the first current;

and a second voltage-current conversion circuit for converting a second differential voltage into a second current using a second resistor, wherein the second differential voltage is between a reference voltage and a voltage obtained by impedance-converting the first current output from the first voltage-current conversion circuit by an impedance conversion circuit, and wherein the output portions of the first and second voltage-current conversion circuits are connected, and the output portion of the impedance conversion circuit serves as an output terminal of the differential amplifier circuit.

2. An apparatus according to claim 1, wherein the differential amplifier circuit is arranged to be supplied with a first image signal obtained immediately after an input portion of the amplification element is reset and a second image signal obtained after accumulation of a predetermined optical signal.

3. An image pickup system comprising:

a solid-state image pickup apparatus which comprises:

a two-dimensional array of pixels each of which includes a photoelectric conversion element which converts an optical signal into signal charges, and an amplification element which amplifies the signal charges;

a plurality of vertical signal lines for reading out signals of pixel lines, respectively;

a horizontal output line connected to the plurality of vertical signal lines via a transfer switch; and a differential amplifier circuit connected to the horizontal output line, wherein the differential amplifier circuit comprises:

a first voltage-current conversion circuit for converting a first differential voltage into a first current using a first resistor and for outputting the first current;

and a second voltage-current conversion circuit for converting a second differential voltage into a second current using a second resistor, wherein the second differential voltage is between a reference voltage and a voltage obtained by impedance-converting the first current output from the first voltage-current conversion circuit by an impedance conversion circuit, and wherein the output portions of the first and second voltage-current conversion circuits are connected, and the output portion of the impedance conversion circuit serves as an output terminal of the differential amplifier circuit; and wherein the image pickup system further comprises:

a signal processing circuit for processing the signals output from the solid-state image pickup apparatus.

* * * * *